United States Patent
Maehara

(10) Patent No.: US 7,897,426 B2
(45) Date of Patent: Mar. 1, 2011

(54) SOLID STATE IMAGING DEVICE AND FABRICATION METHOD OF SOLID STATE IMAGING DEVICE

(75) Inventor: Yoshiki Maehara, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 439 days.

(21) Appl. No.: 12/059,151

(22) Filed: Mar. 31, 2008

(65) Prior Publication Data
US 2008/0246107 A1    Oct. 9, 2008

(30) Foreign Application Priority Data
Mar. 30, 2007    (JP)    ............... 2007-094374

(51) Int. Cl.
*H01L 21/00*    (2006.01)
(52) U.S. Cl. .......................... 438/70; 438/69
(58) Field of Classification Search ............ 438/69–90, 438/E31.073, E31.127, E27.133
See application file for complete search history.

(56) References Cited

U.S. PATENT DOCUMENTS 7,683,302 B2 *    3/2010    Yokozawa .................. 438/70
2004/0185596 A1 *    9/2004    Tanigawa .................... 438/69
2007/0042519 A1 *    2/2007    Nomura et al. ............... 438/34

FOREIGN PATENT DOCUMENTS

JP    2002-502120 A    1/2002
WO    01/82390 A1    11/2001

* cited by examiner

*Primary Examiner*—Cuong Q Nguyen
(74) *Attorney, Agent, or Firm*—Sughrue Mion, PLLC

(57) ABSTRACT

A solid state imaging device comprises: photoelectric conversion portions on or above a substrate; and color filters on or above the respective photoelectric conversion portions. Each of the photoelectric conversion portions comprises: a lower electrode on or above the substrate; a photoelectric conversion film on or above the lower electrode; and an upper electrode on or above the photoelectric conversion film. The device further comprises: a first inorganic material film that protects each of the photoelectric conversion portions, is formed by a first method and is above the upper electrode and below the color filters; a second inorganic material film that prevents characteristic deterioration of the photoelectric conversion portion caused by the first method, is formed by a second method and is between the upper electrode and the first inorganic material film; and a polymeric material film that enhances a function of the first inorganic material film and is on or above the first inorganic material film.

11 Claims, 2 Drawing Sheets

1

SOLID STATE IMAGING DEVICE AND FABRICATION METHOD OF SOLID STATE IMAGING DEVICE

BACKGROUND OF THE INVENTION

1. Field of the Invention

The present invention relates to a solid state imaging device having a plurality of photoelectric conversion portions arranged above a substrate and color filters formed above the plurality of photoelectric conversion portions, respectively.

2. Description of the Related Art

In JP-T-2002-502120 (FIG. 5B), there is disclosed a solid state imaging device configured so that a lower electrode is formed on a Si substrate, a photoelectric conversion film is formed of an organic photoelectric conversion material on the lower electrode, upper electrodes divided for every pixel are formed on the photoelectric conversion film, and color filters divided for every pixel are formed on each of the upper electrodes. According to the solid state imaging device as mentioned above, it is possible to increase light receiving areas of pixels, and thus it is possible to increase sensitivity, as compared with a single plate type solid state imaging device that has been the mainstream until now. In addition, since the entire Si substrate can be used for a circuit of reading out signals based on electric charges generated from the photoelectric conversion film, it is possible to increase the number of pixels even when a decrease in size of the circuit is not achieved.

In WO01/082390 (FIG. 4), there are disclosed an organic EL display configured so that a polymer film is formed on an organic light emitting element array in order to protect organic light emitting elements, and an oxide film is formed on the polymer film by an atomic layer deposition (an ALD method). Since the ALD method makes it possible to form a dense inorganic layer, it is possible to prevent permeation of foreign substance, moisture, or the like into the organic light emitting element, and thus it is possible to prevent performance deterioration of the organic light emitting element.

In a solid state imaging device disclosed in JP-T-2002-502120 (FIG. 5B), since the organic material is used as a photoelectric conversion film, there is concern about characteristic deterioration of the photoelectric conversion film. Accordingly, it is considered that it is effective to use the oxide film formed by the ALD method as described in WO01/082390 (FIG. 4) as a passivation film of the photoelectric conversion film. However, for example, when a metallic oxide and the like having high density are intended to be formed as an oxide film, and when the metallic oxide film is intended to be formed by the ALD method, there is a need to use ozone as a gas therefor. Thus, there is concern about occurrence of deterioration and degeneration caused by the ozone in the upper electrodes and the photoelectric conversion film. As described in WO01/082390 (FIG. 4), even when the polymer film is formed and the ALD method is performed, it is not possible to avoid the problems, that is, the degeneration and deterioration. Accordingly, it is an important object to avoid the problems in order not to deteriorate performance of the solid state imaging device.

SUMMARY OF THE INVENTION

The invention has been made in consideration of the aforementioned situation, in a solid state imaging device including a pair of electrodes and a photoelectric conversion film interposed therebetween, its object is to provide a solid state imaging device capable of preventing deterioration in the process of fabrication and time degradation after fabrication as much as possible.

According to the invention, there is provided a solid state imaging device comprising: a plurality of photoelectric conversion portions on or above a substrate; and color filters on or above the respective photoelectric conversion portions, wherein each of said plurality of photoelectric conversion portions comprises: a lower electrode on or above the substrate; a photoelectric conversion film on or above the lower electrode; and an upper electrode on or above the photoelectric conversion film, and wherein the solid state imaging device further comprising: a first inorganic material film that protects each of said plurality of photoelectric conversion portions, the first inorganic material film being formed by a first method and being above the upper electrode and below the color filters; a second inorganic material film that prevents characteristic deterioration of the photoelectric conversion portion caused by the first method, the second inorganic material film being formed by a second method other than the first method and being between the upper electrode and the first inorganic material film; and a polymeric material film that enhances a function of the first inorganic material film, the polymeric material film being on or above the first inorganic material film.

In the solid state imaging device according to the invention, the first method is an atomic layer deposition.

In the solid state imaging device according to the invention, the first inorganic material film comprises an oxide.

In the solid state imaging device according to the invention, the oxide is an aluminium oxide.

In the solid state imaging device according to the invention, the second inorganic material film comprises a nitride.

In the solid state imaging device according to the invention, the nitride is a silicon nitride.

In the solid state imaging device according to the invention, the second method is a physical vapor deposition.

In the solid state imaging device according to the invention, the polymeric material film comprises a poly-para-xylylene based material.

In the solid state imaging device according to the invention, the photoelectric conversion film comprises an organic photoelectric conversion material.

According to the invention, the solid state imaging device further comprises a signal reading portion that reads out signals based on electric charges generated from said plurality of photoelectric conversion portions respectively, the signal reading portion being in the substrate.

According to the invention, there is provided a fabrication method of a solid state imaging device, in which the solid state imaging device comprises: a plurality of photoelectric conversion portions on or above a substrate; and color filters on or above the respective photoelectric conversion portions, and each of said plurality of photoelectric conversion portions comprises: a lower electrode on or above the substrate; a photoelectric conversion film on or above the lower electrode; and an upper electrode on or above the photoelectric conversion film, the method comprising: forming said plurality of photoelectric conversion portions; forming a first inorganic material film that protects each of said plurality of photoelectric conversion portions above the upper electrode by using a first method, after forming said plurality of photoelectric conversion portions; forming a second inorganic material film that prevents characteristic deterioration of the photoelectric conversion portion caused by the first method on or above the upper electrode by using a second method other than the first method, after forming said plurality of photoelectric conversion portions and before forming the first inorganic material film; forming a polymeric material film that enhances a function of the first inorganic material film on or above the first inorganic material film, after forming the first inorganic material film; and forming the color filters, after forming the polymeric material film.

In the fabrication method of the solid state imaging device according to the invention, the first method is an atomic layer deposition.

In the fabrication method of the solid state imaging device according to the invention, the color filters are plural types of color filters that transmit light having different wavelength regions, respectively; and each of the plural types of color filters are formed by photolithography and etching on forming the color filters.

In the fabrication method of the solid state imaging device according to the invention, the first inorganic material film is formed with an oxide.

In the fabrication method of the solid state imaging device according to the invention, the oxide is an aluminium oxide.

In the fabrication method of the solid state imaging device according to the invention, the second inorganic material film is formed with a nitride.

In the fabrication method of the solid state imaging device according to the invention, the nitride is a silicon nitride.

In the fabrication method of the solid state imaging device according to the invention, the second method is a physical vapor deposition.

In the fabrication method of the solid state imaging device according to the invention, the polymeric material film is formed with a poly-para-xylylene based material.

In the fabrication method of the solid state imaging device according to the invention, an organic photoelectric conversion material is used for the photoelectric conversion film.

In the fabrication method of the solid state imaging device according to the invention, said plurality of photoelectric conversion portions, the first inorganic material film, the second inorganic material film, and the polymeric material film are consistently formed in vacuum or under inert gas atmosphere.

DETAILED DESCRIPTION OF THE INVENTION

Hereinafter, an embodiment of the invention will be described with reference to the drawings.

Figure 1:
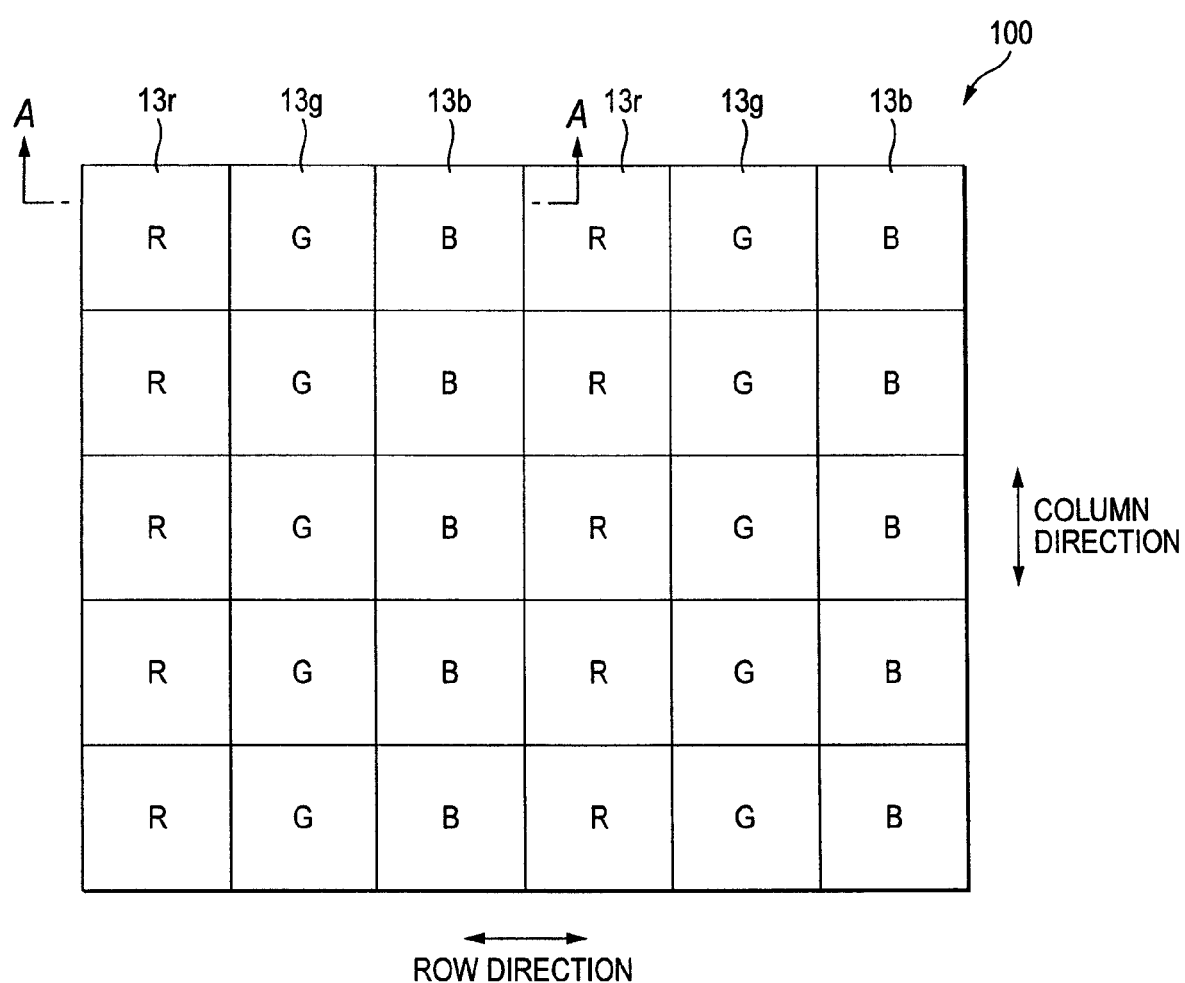
FIG. 1 is a schematic view illustrating a partial surface of an imaging device according to an embodiment of the invention.
Figure 2:
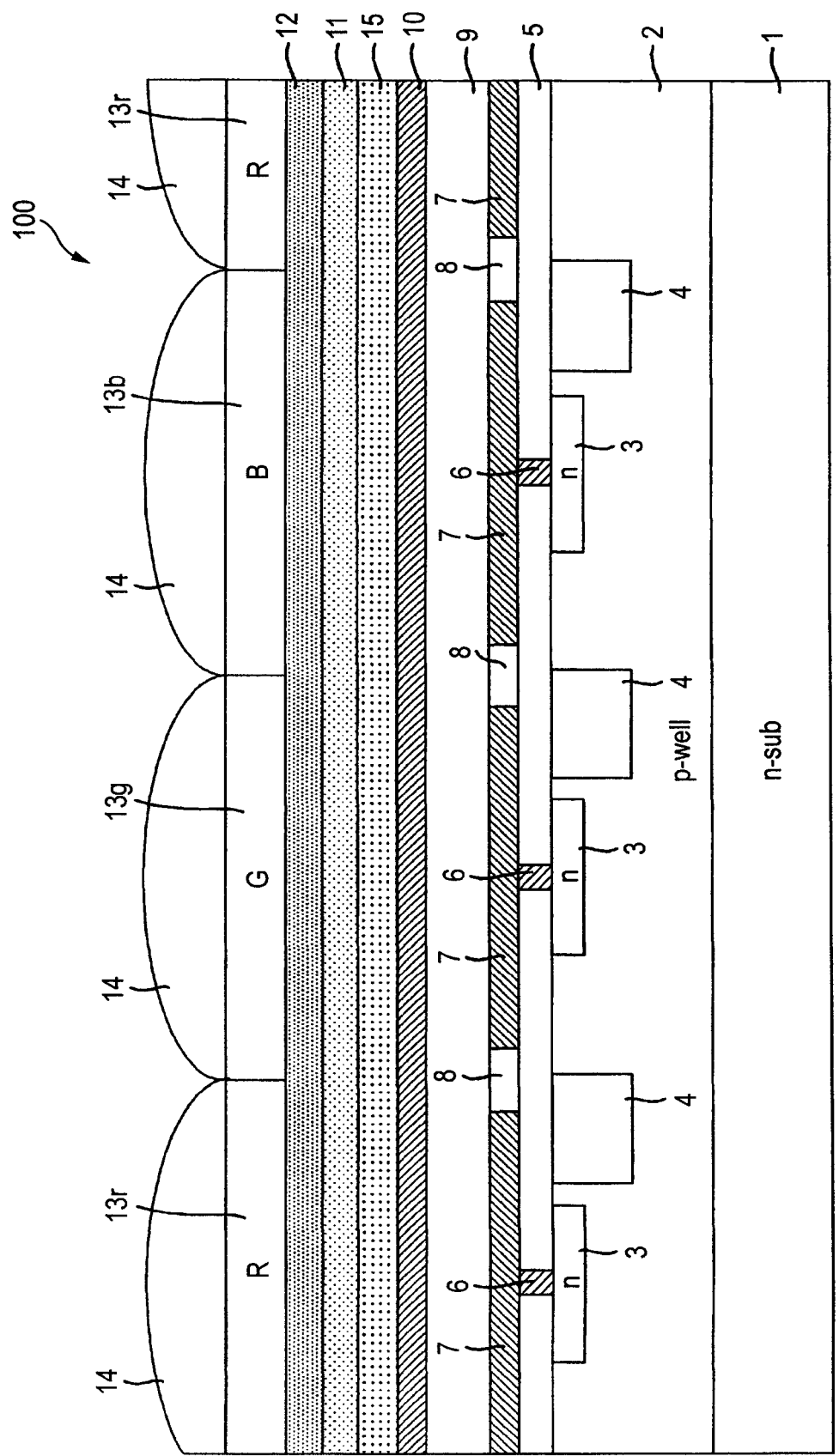
FIG. 2 is a sectional schematic view illustrating the imaging device taken along line A-A shown in FIG. 1.

FIG. 1 is a schematic view illustrating a partial surface of a solid state imaging device 100 according to an embodiment of the invention. FIG. 2 is a sectional schematic view illustrating the solid state imaging device taken along line A-A shown in FIG. 1. In addition, in FIG. 1, a micro lens 14 is omitted.

On an n-type Si substrate 1, a p-well layer 2 is formed. Hereinafter, the n-type silicon substrate 1 and the p-well layer 2 together are referred to as a semiconductor substrate. In addition, the p-type Si substrate may be used as the semiconductor substrate. In a row direction on the identical surface of the upper side of the semiconductor substrate and a column direction orthogonal thereto, there are arranged a lot of color filters. There are three types of color filters including color filters 13r that mainly transmit light in an R wavelength region, color filters 13g that mainly transmit light in a G wavelength region, and color filters 13b that mainly transmit light in a B wavelength region, respectively.

In an array of the color filters 13r, 13g, and 13b, it is possible to employ the color filter array (a Bayer array, a vertical stripe and a horizontal stripe) used in the known single plate type solid state imaging device. Hereinafter, a part overlapping with the color filter 13r is defined as an R pixel portion in plan view, a part overlapping with the color filter 13g is defined as a G pixel portion in plan view, and a part overlapping with the color filter 13b is defined as a B pixel portion in plan view.

The pixel portions are formed above the semiconductor substrate with an insulating film 5 interposed therebetween. The pixel portions include a lower electrode 7 divided for every pixel portion, a photoelectric conversion film 9 formed above the lower electrode 7, an upper electrode 10 formed above the photoelectric conversion film 9, a first passivation film 15 formed on the upper electrode 10, a second passivation film 11 formed on the first passivation film 15, and a third passivation film 12 formed on the second passivation film 11. The color filters of the pixel portions are formed on the third passivation film 12. In each of the pixel portions, a photoelectric conversion portion is configured to be able to take electric charge due to light transmitted through the color filter of each pixel portion by the lower electrode 7, a part of the upper electrode 10 overlapping with the lower electrode 7 in plan view, and a photoelectric conversion section film 9 overlapping with the lower electrode 7.

The upper electrode 10 is made of a transparent conducting material in order to transmit incident light since it is necessary to be incident on the photoelectric conversion film 9. As for a material of the upper electrode 10, it is possible to use a transparent conducting oxide (TCO) having high transmittance in visible light and small resistance value. It is also possible to use a metallic thin film such as Au. However, when 90% or more transmittance is intended to be acquired, the resistance value excessively increases, and thus it is preferred to use TCO. As for the TCO, it is preferred to be able to use an indium tin oxide (ITO), an indium oxide, a stannic oxide, a fluorine doped stannic oxide (FTO), a zinc oxide, an aluminium doped zinc oxide (AZO), a titanium dioxide, and the like. In view of process simplicity, low resistance, and transparency, it is most preferred to use ITO. In addition, the upper electrode 10 is configured to be one common element for the all pixel portions, but may be divided for every pixel portion.

The lower electrode 7 is a thin film divided for every pixel portion, and is made of a transparent conducting material or an opaque conducting material. As for a material of the lower electrode 7, it is possible to use metal such as Cr, In, Al, and Ag or TCO.

The photoelectric conversion film 9 includes a photoelectric conversion material that absorbs light in a specific wavelength region and generates electric charges. As for the photoelectric conversion material, it is preferred to use an organic photoelectric conversion material in that the organic photoelectric conversion material is superior in spectral characteristics and sensitivity. The photoelectric conversion film 9 is configured to be one common element for the all pixel portions, but may be divided for every pixel portion. In the solid state imaging device 100, spectroscopy in pixel portions is performed by the color filters 13r, 13g, and 13b, and thus the photoelectric conversion film 9 is made of a material having an absorption spectrum in which absorptivity is high in the entire range of visible region. In addition, in the photoelectric conversion film 9, it is preferred to use a material having high quantum efficiency in order to maintain high sensitivity.

When a film thickness thereof increases in order to increase light absorptivity, quantum efficiency decreases. Therefore, it is preferred to sufficiently absorb light by using a thinner film made of a material having high absorption coefficient.

In the photoelectric conversion film 9, there is used a material having 50% or more light absorptivity in the range of 400 nm to 700 nm. Therefore, it is possible to obtain image quality enough to take a picture. For example, by using an organic semiconductor, an organic material including an organic coloring agent, an inorganic semiconductor crystal having a direct band gap and a high absorption coefficient, and the like as a single body thereof or a combination among them, it is possible to form a photoelectric conversion film having 50% or more light absorptivity in the wavelength range of 400 nm to 700 nm.

The photoelectric conversion portion including each pixel portion includes at least the following members: the lower electrode 7; the photoelectric conversion film 9; and the upper electrode 10. In such a photoelectric conversion portion, by applying a predetermined bias voltage between the upper electrode 10 and the lower electrode 7, it is possible to move one part of electric charges (positive holes and electrons), which are generated from a part interposed between the lower electrode 7 and the upper electrode 10 of the photoelectric conversion film 9, to the upper electrode 10 and to move the other part of the electric charges to the lower electrode 7. According to the embodiment, a line is connected to the upper electrode 10, and a bias voltage is applied to the upper electrode 10 through the line. In addition, polarity of the bias voltage is determined so that positive holes generated from the photoelectric conversion film 9 move to the lower electrode 7 and electrons move to the upper electrode 10, but the polarity thereof may be opposite thereto.

In the photoelectric conversion portion including each pixel portion, it is possible to dispose a functional film (for example, an electric charge blocking layer for suppressing dark current) for improving a function of the photoelectric conversion element between the lower electrode 7 and the photoelectric conversion film 9, between the upper electrode 10 and the photoelectric conversion film 9, or on both of them.

In the semiconductor substrate under the lower electrode 7 of each pixel portion, by corresponding to the lower electrode 7, there are formed an electric charge accumulating portion 3 formed by an n-type impurity region for accumulating electric charges moving to the lower electrode 7, and a signal reading portion 4 converting the electric charges accumulated in the electric charge accumulating portion 3 into voltage signals and outputting the voltage signals. In the embodiment, the semiconductor substrate is used as a substrate, but it is also allowed to use a substrate such as a glass substrate or a quartz substrate having an electronic circuit installed therein and thereon.

The electric charge accumulating portion 3 is electrically connected to the lower electrode 7 by a plug 6 made of a conductive material and formed to penetrate through an insulating film 5. With such a configuration, it is possible to move the electric charges collected in the lower electrode 7 to the electric charge accumulating portion 3. The signal reading portion 4 is formed by a known CMOS circuit or a combination circuit of a CCD and an amp.

In the insulating film 5, there are formed a light shielding film for shielding the electric charge accumulating portion 3 and the signal reading portion 4 other than the plug 6 from light, a line for driving the signal reading portion 4, and the like.

On each of the color filters 13r, 13g, and 13b, there are formed a micro lens 14 for focusing light on the electric charge accumulating portion 3 corresponding to each of the color filters.

In the solid state imaging device 100, the color filters 13r, 13g, and 13b are formed by a photolithography process and a bake process after the photoelectric conversion portion of each pixel portion is formed. However, the photolithography process or the bake process is performed in a state where the photoelectric conversion film 9 is covered with only the upper electrode 10. In this case, the photoelectric conversion film 9 is degenerated by plasma, solvent, cleaning liquid, heat, and the like used in the process, a defect (a crack, a pin hole, or the like) is caused in the photoelectric conversion film 9 by dust in the fabrication processes, and water, solvent, cleaning liquid, or the like permeates from the defect. Therefore, characteristics of the photoelectric conversion film 9 deteriorate. In addition, even after the color filters 13r, 13g, and 13b are formed, there is possibility that moisture or oxygen permeates into the photoelectric conversion film 9 with the elapse of time, and thereby sometimes performance of the photoelectric conversion film 9 may deteriorate. The characteristic deterioration becomes particularly remarkable when an organic photoelectric conversion material is used as a material of the photoelectric conversion film 9. Accordingly, the solid state imaging device 100 includes a first passivation film 15, a second passivation film 11, and a third passivation film 12 in order to prevent characteristic deterioration of the photoelectric conversion film 9 caused by the fabrication processes and time degradation of the photoelectric conversion film 9 caused by moisture and oxygen.

The second passivation film 11 is a thin film made of a material having transparency and protective functions (denseness that makes it difficult to be permeated by moisture or oxygen, and nonresponsiveness that makes it difficult to react with moisture or oxygen) for the upper electrode 10 and photoelectric conversion film 9. When the second passivation film 11 has 80% or more transmittance in the wavelength range of 400 nm to 700 nm, visible light can be sufficiently incident on the photoelectric conversion film 9 therethrough.

As for the thin film having the protective functions and the transparency, there is a thin film formed of an inorganic material (particularly, an inorganic oxide) deposited by a chemical vapor deposition method such as a plasma CVD, a catalytic CVD, and an atomic layer deposition (ALD method). By using the atomic layer deposition method, it is possible to form a dense inorganic film particularly effective as a passivation film of the photoelectric conversion film 9. The second passivation film 11 is preferably formed of an organic oxide (for example, an aluminium oxide, a silicon oxide, a zirconium oxide, a tantal oxide, a titan oxide, a halfnium oxide, and a magnesium oxide) by a chemical vapor deposition. Among these materials, a material having the highest protective effect is the aluminium oxide deposited by the atomic layer deposition.

The first passivation film 15 is a passivation film provided in order to prevent characteristic deterioration of the photoelectric conversion film 9 and the upper electrode 10 caused by gas (particularly, ozone gas used at the time of depositing an oxide in a way of the atomic layer deposition) used in the chemical vapor deposition, when the second passivation film 11 is formed by the chemical vapor deposition. Hence, it is necessary for the first passivation film 15 to satisfy three conditions where the first passivation film 15 is deposited by a method other than the chemical vapor deposition, is a film having high transparency, and is made of a material capable of protecting the photoelectric conversion film 9 and the upper electrode 10 from the gas used in the chemical vapor deposition. When the first passivation film 15 has 80% or more transmittance in the wavelength range of 400 nm to 700 nm, visible light can be sufficiently incident on the photoelectric conversion film 9 therethrough.

As for the film satisfying the three conditions, there is a thin film of a nitride such as a silicon nitride. By depositing a nitride in a method (for example, the physical vapor deposition) other than the chemical vapor deposition, it is possible to form a dense nitride without practically changing the upper electrode 10 and the photoelectric conversion film 9. Therefore, it is possible to protect the upper electrode 10 and the photoelectric conversion film 9 at the time of forming the second passivation film 11.

The third passivation film 12 is a film that is disposed in order to enhance the protective function of the second passivation film 11. It is preferred that the third passivation film 12 should have high transparency and be made of a material having high coatability on the second passivation film 11. As for such a material, there is a highly polymerized compound. When the second passivation film 11 is a metallic oxide formed by the ALD method, it is preferred that a poly-para-xylylene based resin is used as a material of the third passivation film 12 having high coatability on the metallic oxide. The poly-para-xylylene based resin is formed by the CVD method. When the third passivation film 12 has 80% or more transmittance in the wavelength range of 400 nm to 700 nm, visible light can be sufficiently incident on the photoelectric conversion film 9 therethrough.

In addition, sum of the thicknesses of three passivation films, which are the first passivation film 15, the second passivation film 11, and the third passivation film 12 is preferably in the range of 0.1 μm to 10 μm, is more preferably in the range of 0.5 μm to 5 μm, and is further more preferably in the range of 1 μm to 3 μm.

In the solid state imaging device 100 as described above, red light of incident light is absorbed by the photoelectric conversion film 9 of the R pixel portion and is changed into electric charges. Then, the electric charges are accumulated in the electric charge accumulating portion 3, and are given as an output of a red signal by the signal reading portion 4. In addition, green light of the incident light is absorbed by the photoelectric conversion film 9 of the G pixel portion and is changed into electric charges. Then, the electric charges are accumulated in the electric charge accumulating portion 3, and are given as an output of a green signal by the signal reading portion 4. In addition, blue light of the incident light is absorbed by the photoelectric conversion film 9 of the B pixel portion and is changed into electric charges. Then, the electric charges are accumulated in the electric charge accumulating portion 3, and are given as an output of a blue signal by the signal reading portion 4. As described above, in the solid state imaging device 100, the red signal, the green signal, and the blue signal are generated by taking picture, and thus it is possible to generate color image data by using a known signal process.

Hereinafter, an example of the fabrication method of the solid state imaging device 100 will be described. The insulating film 5 is formed of a silicon oxide on the semiconductor substrate where the electric charge accumulating portion 3 and the signal reading portion 4 are formed by a known process. Then, an opening is formed therethrough by photolithography, and the plug 6 is formed by inserting tungsten into the opening.

Next, an ITO is formed on the insulating film 5 by a sputtering method, and the lower electrode 7 is formed by patterning the ITO with the photolithography and the etching.

Next, the photoelectric conversion film 9 is formed on the lower electrode 7 by depositing the photoelectric conversion material in accordance with a resistive heating evaporation. Then, the upper electrode 10 is formed by depositing the ITO thereon in accordance with the sputtering method.

Next, the first passivation film 15 is formed on the upper electrode 10 by depositing a silicon nitride in accordance with the physical vapor deposition (for example, the sputtering method). Then, the second passivation film 11 is formed thereon by depositing an aluminium oxide in accordance with the chemical vapor deposition (for example, the ALD method), and the third passivation film 12 is formed by depositing a poly-para-xylylene resin in accordance with the CVD method. In addition, it is preferred that the photoelectric conversion portion, the first passivation film 15, the second passivation film 11, and the third passivation film 12 are consistently formed in vacuum or under inert gas atmosphere, in order to prevent the photoelectric conversion portion from getting mixed with a deterioration factor such as moisture or oxygen that causes deterioration thereof at the time of formation.

Next, the color filter 13*r* is formed on the third passivation film 12 by depositing a material of the color filter 13*r* and patterning the material with the photolithography and the etching. The color filter 13*g* is formed on the third passivation film 12 by depositing a material of the color filter 13*g* and patterning the material with the photolithography and the etching. The color filter 13*b* is formed on the third passivation film 12 by depositing a material of the color filter 13*b* and patterning the material with the photolithography and the etching.

Next, the micro lens 14 is formed on the color filters 13*r*, 13*g*, and 13*b*. Then, fabrication of the solid state imaging device 100 is complete.

According to the solid state imaging device 100 of the embodiment as described above, the photoelectric conversion portion of each pixel portion is protected by the second passivation film 11 and the third passivation film 12, and thus it is possible to prevent the characteristic deterioration of the photoelectric conversion portion. Therefore, it is possible to take a picture having high quality. In addition, according to the solid state imaging device 100, the first passivation film 15 is formed between the second passivation film 11 and the photoelectric conversion portion. Thus, when the atomic layer deposition is performed in the state where the first passivation film 15 does not exist, the characteristics of the photoelectric conversion portion deteriorate. However, it is possible to employ a method capable of forming a extremely dense film appropriately serving as the passivation film of the photoelectric conversion portion, in the second passivation film 11. Accordingly, the protective performance can be improved without the characteristic deterioration of the photoelectric conversion portion, and thus it is possible to provide a solid state imaging device having high image quality and superior durability as compared with the known configuration.

Hereinafter, detailed examples of elements of the solid state imaging device will be described. An intermediate layer is interposed between the lower electrode and the upper electrode (it is referred to as an organic layer). The intermediate layer is formed by accumulating or mixing an electromagnetic-wave absorption section, a photoelectric conversion section, an electron transporting section, a positive hole transporting section, an electron blocking section, a positive hole blocking section, a crystallization prevention section, an electrode and interlayer contact improvement section, and the like. It is preferred that the organic layer should contain an organic p-type compound or an organic n-type compound.

The organic p-type semiconductor (compound) is an organic semiconductor (compound) serving as a donor, is mainly represented by a positive hole transporting organic compound, and is defined as an organic compound having a property of easily donating electrons. In further detail, the organic p-type semiconductor is an organic compound having smaller ionization potential among two organic materials employed in contact with each other. Accordingly, any organic compound having a donor property can be used as the donor organic compound.

For example, it is possible to use a metallic complex having a ligand such as a triarylamine compound, a benzidine compound, a pyrazoline compound, a styrylamine compound, a hydrazone compound, a triphenylmethane compound, a carbazole compound, a poly silane compound, a thiophene compound, a phthalocyanine compound, a cyanine compound, a merocyanine compound, an oxonol compound, a polyamine compound, an indole compound, a pyrrolic compound, a pyrazole compound, a polyarylene compound, a condensed aromatic carbocyclic compound (a naphthalene derivative, an anthracene derivative, a phenanthrene derivative, tetracene derivative, a pyrene derivative, a perylene derivative, and a fluoranthene derivative), or a nitrogen-containing heterocyclic compound. In addition, the invention is not limited to this, and as described above, an organic compound having smaller inonization potential than the organic compound used as the n-type (acceptor) compound may be used as the donor organic semiconductor.

The organic n-type semiconductor (compound) is an organic semiconductor (compound) serving as an acceptor, is mainly represented by an electron transporting organic compound, and is defined as an organic compound having a property of easily receiving electrons. In further detail, the organic n-type semiconductor is an organic compound having larger electron affinity among two organic materials employed in contact with each other. Accordingly, any organic compound having an electron-accepting property can be used as the acceptor organic compound. For example, it is possible to use a metallic complex having a ligand such as a condensed aromatic carbon ring compound (a naphthalene derivative, an anthracene derivative, a phenanthrene derivative, a tetracene derivative, a pyrene derivative, a perylene derivative, and a fluoranthene derivative), 5 to 7 membered heterocyclic compounds (a pyridine, a pyrazin, a pyrimidine, a pyridazine, a triazine, a quinoline, a quinoxaline, a quinazoline, a phthalazine, a cinnoline, an isoquinoline, a pteridine, an acridine, a phenazine, a phenanthroline, a tetrazole, a pyrazole, an imidazole, a thiazole, an oxazole, an indazole, a benzimidazole, a benzotriazole, a benzoxazole, a benzothiazole, a carbazole, a purine, a triazolopyridazin, a triazolopyrimidine, a tetrazaindene, an oxadiazole, an imidazopyridine, a pyralidine, a pyrrolopyridine, a thiadiazolopyridine, a dibenzazepine, a tribenzazepine, and the like.) containing nitrogen atoms, oxygen atoms, and sulfur atoms, a polyarylene compound, a fluorene compound, a cyclopentadiene compound, a silyl compound, or a nitrogen-containing heterocyclic compound. In addition, the invention is not limited to this, and as described above, an organic compound having larger electron affinity than the organic compound used as the donor organic compound may be used as the acceptor organic semiconductor.

Any coloring agent may be used as a p-type organic coloring agent or an n-type organic coloring agent. However, there are preferably used a cyanine coloring agent, a styryl coloring agent, a hemicyanine coloring agent, a merocyanine coloring agent (including a zeromethine merocyanine (a simple merocyanine)), a trinuclei merocyanine coloring agent, a tetranuclei merocyanine coloring agent, a rhodacyanine coloring agent, a complex cyanine coloring agent, a complex merocyanine coloring agent, an allopolar coloring agent, an oxonol coloring agent, a hemioxonol coloring agent, a squarylium coloring agent, a croconium coloring agent, an azamethine coloring agent, a coumalin coloring agent, a arylidene coloring agent, an anthraquinone coloring agent, a triphenylmethan coloring agent, an azo coloring agent, an azomethine coloring agent, a spiro compound, a metallocene coloring agent, a fluorenone coloring agent, a fulgide coloring agent, a perylene coloring agent, a phenazine coloring agent, a phenothiazine coloring agent, a quinone coloring agent, an indigo coloring agent, a diphenyl-methane coloring agent, a polyene coloring agent, an acridine dye, an acridinone coloring agent, a diphenylamine coloring agent, a quinacridone coloring agent, a quinophthalone coloring agent, and a phenoxazine coloring agent, a phthaloperylene coloring agent, a porphyrin coloring agent, a chlorophyll coloring agent, a phthalocyanine coloring agent, a metallic complex coloring agent, a condensed aromatic carbocyclic ring based coloring agent (a naphthalene derivative, an anthracene derivative, a phenanthrene derivative, a tetracene derivative, a pyrene derivative, a perylene derivative, and a fluorantene derivative).

Next, a metallic complex compound will be described. The metallic complex compound is a metallic complex having a ligand that includes at least one of nitrogen atoms, oxygen atoms, or sulfur atoms coordinating with metal. Metal ion is not particularly limited, but preferably be beryllium ion, magnesium ion, aluminum ion, gallium ion, zinc ion, indium ion, or tin ion, and more preferably be beryllium ion, aluminum ion, gallium ion or zinc ion, and further more preferably be aluminium or zinc ion. As for a ligand included in the metallic complex, there are various known ligands. Examples thereof are discussed in 'Photochemistry and Photophysics of Coordination Compounds' written by H. Yersin (Springer-Verlag, 1987), and 'Metal Organic Chemistry—Basic and Application—' written by Akio Yamamoto (Shokabo Publishing Co., Ltd. 1982).

As for the ligand mentioned above, there are preferably used a nitrogen-containing heterocyclic ligand (carbon number thereof is preferably in the range of 1 to 30, more preferably in the range of 2 to 20, and further more preferably in the range of 3 to 15. A monodentate ligand or at least bidentate ligand may be employed as the ligand, but the bidentate ligand is preferable. Examples thereof include a pyridine ligand, a bipyridyl ligand, a quinolinol ligand, a hydroxyphenylazole ligand (a hydroxy phenylbenzimidazole, a hydroxy phenylbenzoxazole ligand, and a hydroxy phenylimidazole ligand), and the like.), an alkoxy ligand (carbon number thereof is preferably in the range of 1 to 30, more preferably in the range of 1 to 20, and further more preferably in the range of 1 to 10. Examples thereof include a methoxy, an ethoxy, a butoxy, a 2-ethylhexyloxy, and the like.), an aryloxy ligand (carbon number thereof is preferably in the range of 6 to 30, more preferably in the range of 6 to 20, and further more preferably in the range of 6 to 12. Examples thereof include phenyloxy, 1-naphthyloxy, 2-naphthyloxy, 2,4,6-trimethylphenyloxy, 4-biphenyloxy, and the like.), a heteroaryloxy ligand (carbon number thereof is preferably in the range of 1 to 30, more preferably in the range of 1 to 20, and further more preferably in the range of 1 to 12. Examples thereof include a pyridyloxy, a pyrazyloxy, a pyrimidyloxy, a quinolyloxy, and the like.), an alkylthio ligand (carbon number thereof is preferably in the range of 1 to 30, more preferably in the range of 1 to 20, and further more preferably in the range of 1 to 12. Examples thereof include a methylthio, a ethylthio, and the like.), an arylthio ligand (carbon number thereof is preferably in the range of 6 to 30, more preferably in the range of 6 to 20, and further more preferably in the range of 6 to 12. Examples thereof include a phenylthio and the like.), a heterocyclic-substituted thio ligand (carbon number thereof is preferably in the range of 1 to 30, more preferably in the range of 1 to 20, and further more preferably in the range of 1 to 12. Examples thereof include a pyridylthio, a 2-benzimizolylthio, a 2-benzoxazolylthio, a 2-benzthiazolylthio, and the like.), or a siloxy ligand (carbon number thereof is preferably in the range of 1 to 30, more preferably in the range of 3 to 25, and further more preferably in the range of 6 to 20. Examples thereof include a triphenylsiloxy group, a triethoxysiloxy group, a triisopropylsiloxy group, and the like.). There are more preferably used a nitrogen-containing heterocyclic ligand, an aryloxy ligand, a heteroaryloxy group, or a siloxy ligand, and further more preferably a nitrogen-containing heterocyclic ligand, an aryloxy ligand, or a siloxy ligand.

It is preferred that a photoelectric conversion film (a photosensitive layer) having the p-type semiconductor layer and the n-type semiconductor layer and a bulk heterojunction structure layer as an intermediate layer including the p-type semiconductor and the n-type semiconductor between the semiconductor layers of them be interposed between the lower electrode and the upper electrode. At least one of the p-type semiconductor and the n-type semiconductor is an organic semiconductor. In this case, in the photoelectric conversion film, a bulk heterojunction structure is added to the organic layer, and thus disadvantage that a carrier diffusion length of the organic layer is short is supplemented. Therefore, it is possible to improve photoelectric conversion efficiency. In addition, the bulk heterojunction structure was described in Japanese Patent Application No. 2004-080639 in detail.

It is preferred that a photoelectric conversion film (the photosensitive layer) having two or more repetition structures (the tandem structures) of the p-n junction layer formed of the p-type semiconductor layer and the n-type semiconductor layer be interposed between the lower electrode and the upper electrode. It is more preferred that a thin layer made of the conductive material be inserted into between the repetition structures. In this case, the number of the repetition structure of the p-n junction layer (the tandem structures) is not limited, but in order to increase the photoelectric conversion efficiency, preferably be in the range of 2 to 50, more preferably be in the range of 2 to 30, and further more preferably be 2 or 10. As for the conductive material, it is preferred to employ silver or gold, and it is more preferred to employ silver. In addition, the tandem structure was described in Japanese Patent Application No. 2004-079930 in detail.

In a photoelectric conversion film having the p-type semiconductor layer and the n-type semiconductor layer (preferably, mixed distribution (the bulk heterojunction structure) layers) formed between the lower electrode and the upper electrode, it is preferred that a photoelectric conversion film include an aligned organic compound in at least one of the p-type semiconductor and the n-type semiconductor, and more preferably include an aligned (alignable) organic compound in both of the p-type semiconductor and the n-type semiconductor. In this case, as for an organic compound used in the organic layer of the photoelectric conversion film, an organic compound having π conjugated electron is preferably used. However, it is more preferred to align the π electron plane at an angle formed not to be perpendicular to the substrate (the electrode substrate) but to be substantially more parallel thereto. The angle with respect to the substrate is preferably in the range of 0 to 80 degrees, is more preferably in the range of 0 to 60 degrees, is more preferably in the range of 0 to 40 degrees, is more preferable in the range of 0 to 20 degrees, is further more preferably in the range of 0 to 10 degrees, and is most preferably 0 degree (that is, an angle parallel to the substrate). As described above, there may be no problem when at least a part of the entire organic layer includes the aligned organic compound layer. However, the ratio of an aligned part to the entire organic layer is preferably 10% or more, is more preferably 30% or more, is more preferably 50% or more, is more preferably 70% or more, is further more preferably 90% or more, and is most preferably 100%. In this situation, in the photoelectric conversion film, alignment of the organic compound of the organic layer is controlled, and thus disadvantage that a carrier diffusion length of the organic layer is short is supplemented. Therefore, it is possible to improve photoelectric conversion efficiency.

It is preferred that the alignment of the organic compound be controlled, and it is more preferred that a heterojunction surface (for example, a p-n junction surface) is not parallel to the substrate. In this case, it is more preferred to align the heterojunction surface at an angle formed not to be perpendicular to the substrate (the electrode substrate) but to be substantially more parallel thereto. The angle with respect to the substrate is preferably in the range of 10 to 90 degrees, is more preferably in the range of 30 to 90 degrees, is more preferably in the range of 50 to 90 degrees, is more preferably in the range of 70 to 90 degrees, is further more preferably in the range of 80 to 90 degrees, and is most preferably 90 degree (that is, an angle parallel to the substrate). As described above, there may be no problem when at least a part of the entire organic layer includes the organic compound layer where the heterojunction surface is controlled. However, the ratio of an aligned part to the entire organic layer is preferably 10% or more, is more preferably 30% or more, is more preferably 50% or more, is more preferably 70% or more, is further more preferably 90% or more, and is most preferably 100%. In this case, an area of the heterojunction surface in the organic layer increases, and the amount of the carrier such as electrons, positive holes, and pairs of electrons and positive holes increases. Therefore, it is possible to improve photoelectric conversion efficiency. As described above, in the photoelectric conversion film where alignment of both of the π electron plane and heterojunction surface of the organic compound is controlled, particularly, it is possible to improve photoelectric conversion efficiency. These situations were described in Japanese Patent Application No. 2004-079931 in detail.

It is more preferred that a film thickness of an organic pigment layer more increases. However, in consideration of a ratio of a part that does not contribute to electric charge separation, the film thickness of the organic pigment layer is preferably in the range of 30 nm to 300 nm, is more preferably in the range of 50 nm to 250 nm, and is further more preferably in the range of 80 nm to 200 nm.

(Method of Forming Organic Layer)

A layer containing these organic compounds is formed by a dry film formation method or a wet film formation method. Examples of the dry film formation method include a physical vapor deposition method such as a vacuum deposition method, a sputtering method, an ion plating method, and a molecular beam epitaxy method, or a chemical vapor deposition method such as a plasma polymerization. Examples of the wet film formation method include a coating method, as pin coating method, a dip coating method, and a LB method. When at least one of a p-type semiconductor (compound) and an n-type semiconductor (compound) is used as a polymer compound, it is preferred to use the wet film formation method that can be easy to form a film. When the dry film formation method such as a vapor deposition is used, there is concern about decomposition. Thus, it is difficult to use polymer in deposition, and so it is preferred to use oligomer therein instead of the polymer. Meanwhile, when low molecular is used in deposition, the dry film formation method is preferably used, and particularly the vacuum deposition method is preferably used. In the vacuum deposition method, basic parameters include a compound heating method such as a resistive heating evaporation method and an electron-beam heating deposition method, a melting pots, a deposition source shape such as a boat shape, a vacuum degree, a deposition temperature, deposition speed, and the like. In order to deposit uniformly, it is preferred that deposition is performed while the substrate is rotated. The vacuum degree is preferably high, and so the vacuum deposition is preferably performed at $10^{-2}$ Pa or less, more preferably at $10^{-4}$ Pa or less, and further more preferably at $10^{-6}$ Pa or less. All deposition processes are preferably performed in vacuum, and thus generally a compound is made not to directly contact oxygen and moisture of the outer atmosphere. Since the aforementioned conditions of the vacuum deposition have effects on crystallinity, amorphous nature, density, compaction, and the like of an organic film, it is necessary to precisely control the conditions. It is preferred to use a PI or PID control for controlling deposition speed by using a film thickness monitoring device such as a quartz vibrator or an interferometry. When two types of compounds are deposited simultaneously, it is preferred to use a co-evaporation method, a flash deposition method, and the like.

(Electrode)

The electrodes of an organic electromagnetic-wave absorption/photoelectric conversion section will be described in detail. The photoelectric conversion film of the organic layer is sandwiched by a pixel electrode film (the lower electrode) and an opposite electrode film (the upper electrode), and can include a material between the electrodes and the like. The pixel electrode film is defined as an electrode film formed above the substrate having an electric charge accumulating/transporting/reading section formed thereon, and is divided for each one pixel. With such a configuration, it is possible to form an image on the substrate having a circuit of accumulating, transporting, and reading signal charges by reading out the signal charges converted by the photoelectric conversion film for each one pixel. The opposite electrode film is configured so that the photoelectric conversion film is interposed between the opposite electrode film and the pixel electrode film, and has a function of discharging signal charges having an opposite polarity to the signal charges. The discharge of the signal charges does not need to be separately performed for each pixel, and thus generally, the opposite electrode film can be commonly used for the pixels. Hence, it is called a common electrode film. The photoelectric conversion film is located between the pixel electrode film and the opposite electrode film. The function of photoelectric conversion is operated by the photoelectric conversion film, the pixel electrode film, and the opposite electrode film. As for an exemplary configuration of laminating the photoelectric conversion film, when one organic layer is laminated on the substrate, there is a configuration of laminating the substrate, the pixel electrode film, (generally, a transparent electrode film), the photoelectric conversion film, and the opposite electrode film (a transparent electrode film) in ascending order, but the invention is not limited to this. In addition, when two organic layers are laminated on the substrate, there is an exemplary configuration of laminating the substrate, the pixel electrode film (generally, a transparent electrode film), the photoelectric conversion film, the opposite electrode film (a transparent electrode film), an interlayer insulating film, the pixel electrode film (generally, a transparent electrode film), the photoelectric conversion film, and the opposite electrode film (a transparent electrode film) in ascending order.

It is preferred that a material of the transparent electrode film forming the photoelectric conversion section can be deposited by a film-forming device not using plasma, an EB vapor deposition device, and a pulse laser vapor deposition device. Examples of the material include a metal, an alloy, a metallic oxide, a metal nitride, a metal bromide, an organic conductive compound, and a mixture of them. Specific examples thereof further include: conductive metallic oxides such as a stannic oxide, a zinc oxide, an indium oxide, an ITO, an IZO, and an indium oxide tungsten (IWO); metal nitrides such as a titanium nitride; metals such as a gold, a platina, a silver, a chrom, a nickel, and an aluminium; mixtures or laminated materials among these metals and the conductive metallic oxides; inorganic conductive materials such as a copper iodide and a copper sulfide; organic conductive materials such as a polyaniline, a polythiophene, and a polypyrrole; and laminated materials among these materials and an ITO. In addition, it is allowed to employ specific materials described in 'New Development in Transparent Conductive Film' under the editorship of Yutaka Sawada (CMC Publishing CO., LTD., 1999), 'New Development in Transparent Conductive Film II' under the editorship of Yutaka Sawada (CMC Publishing CO., LTD., 2002), 'Technology in Transparent Conductive Film' written by Japan Society for the Promotion of Science (Ohmsha, Ltd., 1999), and the like.

As for materials of the transparent electrode film, it is particularly preferred to use any one material of an ITO, an IZO, a stannic oxide, an antimony doped stannic oxide (an ATO), a FTO, a zinc oxide, an AZO, a gallium doped zinc oxide (a GZO), and a titanium dioxide. Light transmittance of the transparent electrode film in a light-absorption peak wavelength of the photoelectric conversion film at the time of photoelectric conversion is preferably 60% or more, is more preferably 80% or more, is further preferably 90% or more, and is further more preferably 95% or more. Here, the photoelectric conversion film is included in the photoelectric conversion device including the transparent electrode film. In addition, the preferred range of a surface resistance of the transparent electrode film is different according to conditions where whether the transparent electrode is the pixels electrode or is the opposite electrode and whether the electric charge accumulating/transporting/reading section has a CCD structure or is a CMOS structure. When the electric charge accumulating/transporting/reading section has the CMOS structure, the surface resistance thereof is preferably 10000Ω/□ or less, and is more preferably 1000Ω/□ or less. When the electric charge accumulating/transporting/reading section has the CCD structure, the surface resistance thereof is preferably 1000Ω/□ or less, and is more preferably 100Ω/□ or less. When the transparent electrode is the pixels electrode, the surface resistance thereof is preferably 1000000Ω/□ or less, and is more preferably 100000Ω/□ or less.

Conditions at the time of forming the transparent electrode film will be described. Substrate temperature at the time of forming the transparent electrode film is preferably 500° C. or less, is more preferably 300° C. or less, is further preferably 200° C. or less, and is further more preferably 150° C. or less. In addition, it is allowed to apply a gas in the process of forming the transparent electrode film, and generally the gas type is not limited. Accordingly, it is possible to use argon, helium, oxygen, nitrogen, and the like. In addition, it is also allowed to use a mixed gas of these gases. Particularly, when the material is an oxide, there are a lot of cases where oxygen defects occur therein. Thus, it is preferred to use oxygen.

It is preferred to apply a voltage to the photoelectric conversion film in that the photoelectric conversion efficiency improves. Any voltage can be used as the applied voltage, but a required voltage depends on the film thickness of the photoelectric conversion film. Specifically, the photoelectric conversion efficiency gradually improves as electric field applied to the photoelectric conversion film increases. However, even when the same voltage is applied, the applied electric field gradually increases as the film thickness of the photoelectric conversion film decreases. Accordingly, when the film thickness of the photoelectric conversion film is small, the applied voltage may be relatively small. The electric field applied to the photoelectric conversion film is preferably $10\ V \cdot m^{-1}$ or more, is more preferably $1 \times 10^3\ V \cdot m^{-1}$ or more, is further preferably $1 \times 10^5\ V \cdot m^{-1}$ or more, is further more preferably $1 \times 10^6\ V \cdot m^{-1}$ or more, and is most preferably $1 \times 10^7\ V \cdot m^{-1}$ or more. In this case, there is no upper limit, but it is not preferred to apply electric field too much since current flows even in darkness. Accordingly, the electric field is preferably $1 \times 10^{12}\ V \cdot m^{-1}$ or less, and is more preferably $1 \times 10^9\ V \cdot m^{-1}$ or less.

(Auxiliary Layer)

It is preferred to have an ultraviolet absorption layer and/or an infrared absorption layer formed on an uppermost layer of the electromagnetic-wave absorption/photoelectric conversion section. The ultraviolet absorption layer can absorb or reflect light having a wavelength of at least 400 nm or less, and has preferably 50% or more absorptivity in the wavelength region of 400 nm or less. The infrared absorption layer can absorb or reflect light having a wavelength of at least 700 nm or more, and has preferably 50% or more absorptivity in the wavelength region of 700 nm or more. The ultraviolet absorption layer and the infrared absorption layer can be formed by a known method. For example, there has been known a method that a mordanting layer made of a hydrophilic macromolecule material such as a gelatine, a casein, a glue, or a polyvinylalcohole is provided, a coloring agent having a desired absorption wavelength adds or dyes to the mordanting layer, and the coloring layer is formed. In addition, there has been known a method of using a coloring resin where one type of colorant is dispersed in the transparent resin. For example, as described in Japanese Unexamined Patent Application Publication No. S58-46325, Japanese Unexamined Patent Application Publication No. S60-78401, Japanese Unexamined Patent Application Publication No. S60-184202, Japanese Unexamined Patent Application Publication No. S60-184203, Japanese Unexamined Patent Application Publication No. S60-184204, Japanese Unexamined Patent Application Publication No. S60-184205, and the like, it is possible to use a coloring resin film that mixes the colorant with a polyamino based resin. It is possible to employ a colorant using a polyimide resin having photosensitivity. It is also possible to disperse a coloring material in the aromatic polyamide resin that has a group having photosensitivity described in Japanese Examined Patent Application Publication No. H7-113685 in a molecular, and can obtain cured film at 200° C. or less. It is also possible to use a dispersing and coloring resin of content described in Japanese Examined Patent Application Publication No. H7-69486. It is preferred to use a dielectric multi-layered film. The dielectric multi-layered film has high wavelength dependency in light transmittance, and is preferably used. In addition, the micro lens array is formed above the light receiving element, and thus it is possible to improve a focus effect. Therefore, the aspect is preferred.

(Electric Charge Storing/Transporting/Reading Section)

The electric charge transporting/reading section was described in Japanese Unexamined Patent Application Publication No. S58-103166, Japanese Unexamined Patent Application Publication No. S58-103165, Japanese Unexamined Patent Application Publication No. 2003-332551, and the like. It is possible to appropriately employ a configuration where a MOS transistor is formed for each pixel on the semiconductor substrate or a configuration where the transistor has a CCD as an element. For example, in the case of the photoelectric conversion element using the MOS transistor, electric charges are generated in the photoconductive film by incident light, and a voltage is applied to an electrode. Thus, the electric charges are traveled to the electrode through the photoconductive film and moves to the electric charge accumulating portion of the MOS transistor by electric field generated between the electrodes, so that the electric charges are accumulated in the electric charge accumulating portion. The electric charges accumulated in the electric charge accumulating portion are moved to the electric charge reading portion by a switching operation of the MOS transistor, and are given as an output of electric signals. With such a configuration, the solid state imaging device including a signal processing portion receives an input of the signals of a full colored image. A constant amount of bias electric charges is applied to an accumulation diode (a refresh mode), the constant electric charges are accumulated (a photoelectric conversion mode), and then it is possible to read out the signal charges. The light receiving element itself may be used as the accumulation diode, or separately, an accumulation diode may be added.

The operation of reading out signals will be described in detail. The operation of reading out signals can be performed by a normal color reading circuit. The signal charge or signal current converted optically/electrically in the light receiving portion is accumulated in the light receiving portion itself or a capacitor additionally formed thereon. The accumulated electric charges are read out with selection of a pixel position by means of a MOS type imaging device (a so-called CMOS sensor) using an X-Y address system. Otherwise, as for the system of selecting address, there is a system that the address is sequentially selected by a multiplexer switch and a digital shift register one by one pixel, and is given as an output of a signal voltage (or electric charges) to the common output line. As for the CMOS sensor, there has been known an imaging device using the X-Y address system and formed as an array on two dimensions. That is, a switch disposed on each pixel connected to an intersection point of X-Y is connected to a vertical scan shift register, and the signal read out from each pixel arranged on the same row line is given as an output to the column directional output line when a voltage supplied from the vertical scan shift register makes the switch turn on. The signals are sequentially read out from an output terminal via the switch driven by a horizontal scan shift register.

In order to read out the output signals, it is possible to use a floating diffusion detector or a floating gate detector. In addition, by using a method that a signal amplifier is disposed on a pixel portion or a method of correlated double sampling, it is possible to improve a ratio of signal to noise (S/N).

In the signal processing, it is possible to perform a gamma correction due to an ADC circuit, a digitalization due to an AD converter, a brightness signal processing, and a color signal processing. As for the color signal processing, there are a white balance processing, a color separation processing, a color matrix processing, and the like. In the case of an NTSC system, a conversion processing can be performed on RGB signals to convert into YIQ signals.

In the electric charge transporting/reading section, it is required that electric charge mobility is 100 $cm^2 \cdot V^{-1} \cdot s^{-1}$ or more. The mobility can be obtained by selecting materials from a group IV, groups III to V, and groups II to VI semiconductors. Among the semiconductors, it is preferred to use a Si semiconductor in view of progress in miniaturization technology and low costs. A lot of systems of transporting electric charges and reading out electric charges have been contrived. Accordingly, any system may be used. Particularly, the system is preferably the CMOS type or the CCD type device. In addition, the CMOS type is more preferred in view of a high speed reading, a pixel addition, a partly reading, power consumption, and the like.

(Connection)

It is preferred that the plurality of contact sections that connects the electromagnetic-wave absorption/photoelectric conversion section with the electric charge transporting/reading section may be made of any metal, but it is preferred to select the metal from copper, silver, gold, chrome, and tungsten. It is necessary to dispose contact sections between the electric charge transporting/reading sections, respectively, in the plurality of electromagnetic-wave absorption/photoelectric conversion sections.

(Process)

The photoelectric conversion element can be fabricated by a so-called microfabrication process used in fabrication of a known integrated circuit and the like. Generally, the method includes steps of a pattern exposure (mercurial i and g emission lines, an excimer laser, an X-ray, and an electron beam) using active light, electron beam, or the like, a pattern formation due to a development and/or a bake, an arrangement (coating, vapor deposition, sputtering, CV, and the like) of materials for forming a device, a repeat operation of removing (heat processing, dissolution processing, and the like) materials formed on non-pattern portion.

According to the invention, in a solid state imaging device including a pair of electrodes and a photoelectric conversion film interposed therebetween, it is possible to provide a solid state imaging device capable of preventing deterioration in the process of fabrication and time degradation after fabrication as much as possible.

The entire disclosure of each and every foreign patent application from which the benefit of foreign priority has been claimed in the present application is incorporated herein by reference, as if fully set forth.

What is claimed is:

1. A fabrication method of a solid state imaging device, in which the solid state imaging device comprises: a plurality of photoelectric conversion portions on or above a substrate; and color filters on or above the respective photoelectric conversion portions, and each of said plurality of photoelectric conversion portions comprises: a lower electrode on or above the substrate; a photoelectric conversion film on or above the lower electrode; and an upper electrode on or above the photoelectric conversion film, the method comprising:

forming said plurality of photoelectric conversion portions;

forming a first inorganic material film that protects each of said plurality of photoelectric conversion portions above the upper electrode by using a first method, after forming said plurality of photoelectric conversion portions;

forming a second inorganic material film that prevents characteristic deterioration of the photoelectric conversion portion caused by the first method on or above the upper electrode by using a second method other than the first method, after forming said plurality of photoelectric conversion portions and before forming the first inorganic material film;

forming a polymeric material film that enhances a function of the first inorganic material film on or above the first inorganic material film, after forming the first inorganic material film; and forming the color filters, after forming the polymeric material film.

2. The fabrication method of the solid state imaging device according to claim 1, wherein the first method is an atomic layer deposition.

3. The fabrication method of the solid state imaging device according to claim 1, wherein the color filters are plural types of color filters that transmit light having different wavelength regions, respectively; and wherein each of the plural types of color filters are formed by photolithography and etching on forming the color filters.

4. The fabrication method of the solid state imaging device according to claim 1, wherein the first inorganic material film is formed with an oxide.

5. The fabrication method of the solid state imaging device according to claim 4, wherein the oxide is an aluminium oxide.

6. The fabrication method of the solid state imaging device according to claim 1, wherein the second inorganic material film is formed with a nitride.

7. The fabrication method of the solid state imaging device according to claim 6, wherein the nitride is a silicon nitride.

8. The fabrication method of the solid state imaging device according to claim 1, wherein the second method is a physical vapor deposition.

9. The fabrication method of the solid state imaging device according to claim 1, wherein the polymeric material film is formed with a poly-para-xylylene based material.

10. The fabrication method of the solid state imaging device according to claim 1, wherein an organic photoelectric conversion material is used for the photoelectric conversion film.

11. The fabrication method of the solid state imaging device according to claim 1, wherein said plurality of photoelectric conversion portions, the first inorganic material film, the second inorganic material film, and the polymeric material film are consistently formed in vacuum or under inert gas atmosphere.

* * * * *